(12) United States Patent
Liu et al.

(10) Patent No.: US 10,978,440 B2
(45) Date of Patent: Apr. 13, 2021

(54) CIRCUIT LAYOUT METHOD

(71) Applicant: TAIWAN SEMICONDUCTOR MANUFACTURING COMPANY, LTD., Hsinchu (TW)

(72) Inventors: Shou-En Liu, Hsinchu (TW); Chun-Wei Chang, Taoyuan (TW); Bi-Ling Lin, Hsinchu (TW); Yung-Sheng Tsai, Hsinchu (TW); Jiaw-Ren Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/533,985

(22) Filed: Aug. 7, 2019

(65) Prior Publication Data

US 2019/0363075 A1 Nov. 28, 2019

Related U.S. Application Data

(63) Continuation of application No. 14/527,381, filed on Oct. 29, 2014, now Pat. No. 10,403,621.

(51) Int. Cl.
*H01L 27/02* (2006.01)
*H01L 29/423* (2006.01)
*H01L 27/092* (2006.01)
*H01L 27/088* (2006.01)

(52) U.S. Cl.
CPC ...... *H01L 27/0211* (2013.01); *H01L 27/0203* (2013.01); *H01L 27/0207* (2013.01); *H01L 27/092* (2013.01); *H01L 29/4238* (2013.01); *H01L 29/42372* (2013.01); *H01L 27/0886* (2013.01); *H01L 27/0924* (2013.01)

(58) Field of Classification Search
CPC ............. H01L 29/4238; H01L 27/0211; H01L 27/0203; H01L 27/0207; H01L 29/42372
See application file for complete search history.

(56) References Cited

U.S. PATENT DOCUMENTS

| | | | |
|---|---|---|---|
| 3,952,258 | A | 4/1976 | Smulders |
| 4,642,668 | A | 2/1987 | Tacken |
| 6,236,232 | B1 | 5/2001 | Barnes |
| 6,492,847 | B1 | 12/2002 | Goetz |
| 6,525,354 | B2 | 2/2003 | Masleid |
| 6,732,344 | B2 | 5/2004 | Sakamoto |

(Continued)

*Primary Examiner* — Tuan A Hoang
(74) *Attorney, Agent, or Firm* — Hauptman Ham, LLP

(57) ABSTRACT

A method includes identifying fingers of a first device and fingers of a second device. The method includes grouping the fingers of the first device into a first finger group and a second finger group, wherein the first finger group is electrically connected to the second finger group. The method further includes positioning the first finger group extends across a first doped region. The method further includes positioning the second finger group extends across a second doped region, wherein the second doped region has a same dopant type as the first doped region. The method further includes grouping the fingers of the second device into a third finger group and a fourth finger group, wherein the third finger group is electrically connected to the fourth finger group. The method further includes positioning the third finger group and the fourth finger group extending across the second doped region.

20 Claims, 7 Drawing Sheets

(56) References Cited

U.S. PATENT DOCUMENTS

| | | | |
|---|---|---|---|
| 7,791,160 B2 * | 9/2010 | Kim | H01L 29/4238 257/499 |
| 7,851,833 B2 | 12/2010 | Abe | |
| 7,941,776 B2 | 5/2011 | Majumder | |
| 8,502,604 B2 * | 8/2013 | Lee | G06F 30/39 330/257 |
| 8,653,564 B1 * | 2/2014 | Zhan | H01L 27/0207 257/213 |
| 8,653,601 B2 | 2/2014 | Hirotsu | |
| 8,762,911 B1 * | 6/2014 | Lu | G06F 30/39 716/110 |
| 2013/0026576 A1 * | 1/2013 | Stockinger | H01L 27/0255 257/355 |
| 2014/0103434 A1 | 4/2014 | Lu | |

* cited by examiner

CIRCUIT LAYOUT METHOD

PRIORITY CLAIM

The present application is a continuation of U.S. application Ser. No. 14/527,381, filed Oct. 29, 2014, which is incorporated herein by reference in its entirety.

BACKGROUND

Circuits often include numerous active devices and passive devices electrically connected together. In some instances, active devices include multiple fingers. Fingers help to spread a current through a device over multiple sub-devices. In an example of a metal oxide semiconductor (MOS) transistor, each sub-device includes a source, a drain and a gate. The gate of the sub-device is called a finger. In some approaches, fingers for each device are grouped together in close proximity to each other in order to reduce a complexity of electrical connections between the various sub-devices.

During operation of a circuit, certain devices have a higher power density than other devices. Resistance within devices results in production of heat as a current passes through the device. As the power density of a device increases, resistance within the device causes an increase in a temperature rise of the circuit around the device. In addition, as node sizes decrease, planar transistors are being converted to three-dimensional channel transistors in order to save space within the circuit. These three-dimensional channel transistors have reduced heat dissipation capacity in comparison with planar transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
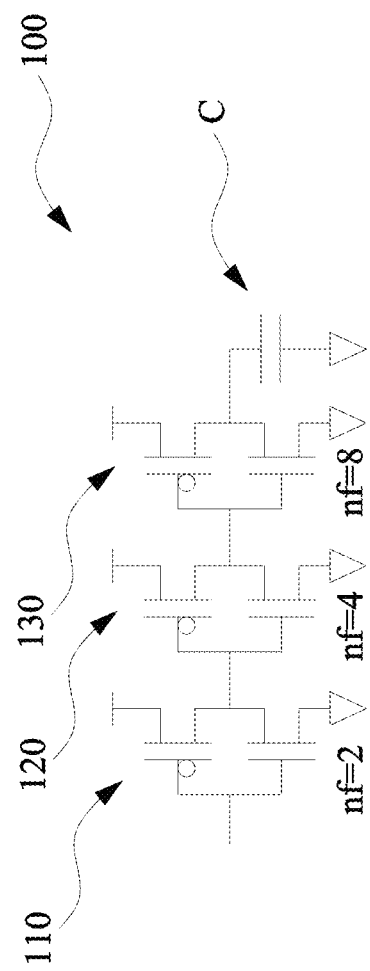
FIG. 1A is a schematic diagram of a circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic diagram of a circuit 100 in accordance with some embodiments. Circuit 100 includes a first inverter 110. First inverter 110 includes two fingers, as indicated by nf=2 in FIG. 1A. An output of first inverter 110 is connected to a second inverter 120. Second inverter 120 includes four fingers, as indicated by nf=4 in FIG. 1A. An output of second inverter 120 is connected to a third inverter 130. Third inverter 130 includes eight fingers, as indicated by nf=8 in FIG. 1A. An output of third inverter 130 is connected to a ground voltage through a capacitor C. Circuit 100 is merely an exemplary circuit used to help explain a layout according to some embodiments. In some embodiments, transistors of at least one of first inverter 110, second inverter 120 or third inverter 130 are three dimensional channel transistors, such as fin field-effect transistors (FinFET), tri-gate transistors, gate-all-around (GAA) transistors, or other suitable three dimensional channel transistors.

Fingers are parallel transistor gates of a same transistor. Instead of a transistor having a single large gate, the large gate is divided into smaller gates called fingers. Each of the fingers of a same transistor extends across a same doped region or a same doped regions. In some embodiments, each finger in a transistor has a same width as each other finger in the transistor. In some embodiments, at least one finger in a transistor has a different width from at least one other finger of the transistor.

Figure 1B:
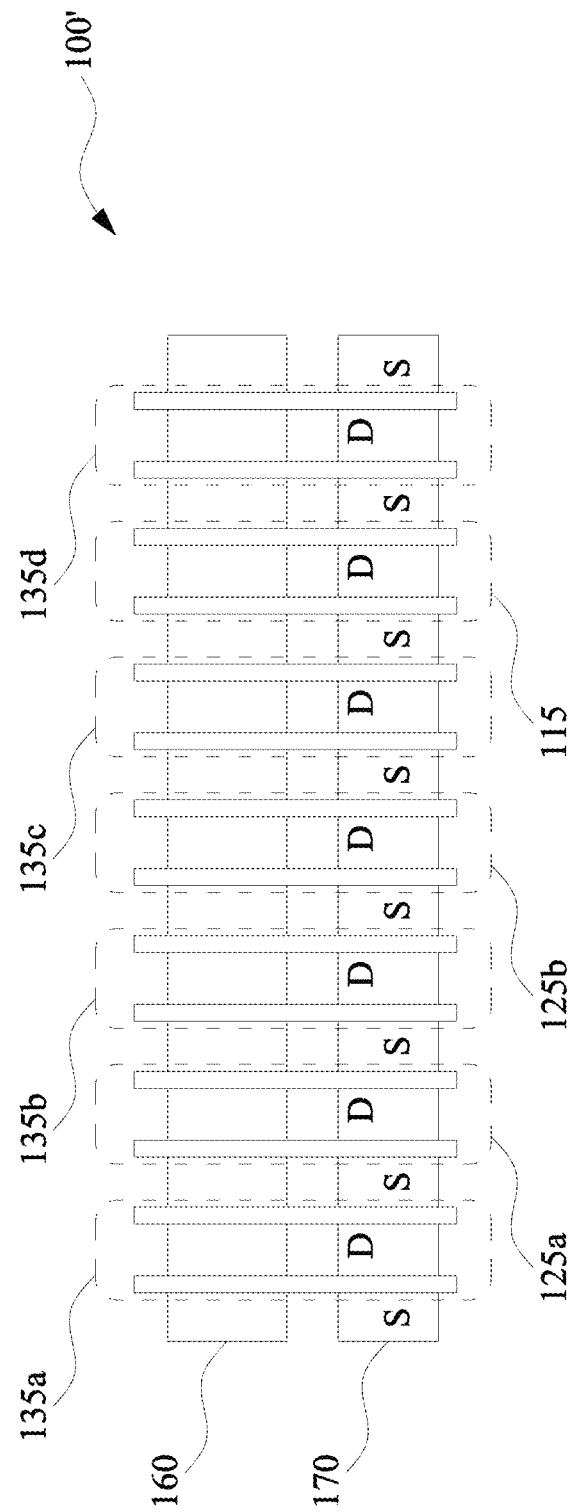
FIG. 1B is a top view of a layout of a circuit in accordance with some embodiments.

FIG. 1B is a top view of a layout 100' of a circuit in accordance with some embodiments. Layout 100' is a layout of circuit 100 (FIG. 1A). Layout 100' includes finger group 115 of first inverter 110 extending across a p-type doped region 160 in a substrate (not shown) and an n-type doped region 170 in the substrate. Layout 100' also includes finger groups 125a and 125b of second inverter 120 extending across p-type doped region 160 and n-type doped region 170. Layout 100' further includes finger groups 135a, 135b, 135c and 135d of third inverter 130 extending across p-type doped region 160 and n-type doped region 170. N-type doped region 170 includes source (S) regions and drain (D) regions. Source and drain regions in p-type doped region 160 are not labeled for clarity.

Layout 100' includes each finger group for a specific inverter separated from an adjacent finger group of the same inverter by a finger group of a different inverter. In some embodiments, finger groups of a same inverter are separated from each other by a finger group of more than one other inverter. Finger group 115 includes both fingers of first inverter 110. Finger group 125a includes two fingers of the four finger of second inverter 120. Similarly, finger group 125b includes two fingers of the four fingers of second inverter 120. Finger group 125a is separated from finger group 125b by finger group 135b of third inverter 130. Each of finger group 135a, finger group 135b, finger group 135c and finger group 135c includes two fingers of the eight fingers of third inverter 130. Finger group 135a is separated from finger group 135b by finger group 125a. Finger group 135b is separated from finger group 135c by finger group 125b. Finger group 135c is separated from finger group 135d by finger group 115. In some embodiments, a number of fingers in at least one finger group of at least one of first inverter 110, second inverter 120, or third inverter 130 is greater than two. In some embodiments, a number of fingers in each finger group of first inverter 110, second inverter 120, or third inverter 130 is an even integer greater than or equal to two. In some embodiments, a number of fingers in at least one finger group of a device is different from a number of fingers in at least another finger group of the same device. For example, in some embodiments, a number of fingers in finger group 135a is different from a number of fingers in finger group 135b.

By separating the finger groups for each inverter, heat generated by each inverter is spread over a larger area of layout 100' in comparison with approaches which arrange all finger groups together. Arranging all finger groups together helps to reduce complexity of routing electrical connections between different parts of the inverter. However, in instances where an inverter includes a higher power density than other surrounding inverters, a hot spot is created. The hot spot is a location where a temperature of the layout is non-uniformly increased in comparison with other portions of the layout. In some instances, the hot spot reduces reliability of the layout due to the non-uniform thermal properties of the layout. In some instances, determining which inverter will experience a higher power density prior to production and operation of the circuit is difficult to determine. The difficulty in determining power density increases difficulty in adjusting for the formation of hot spots following production.

Figure 1C:
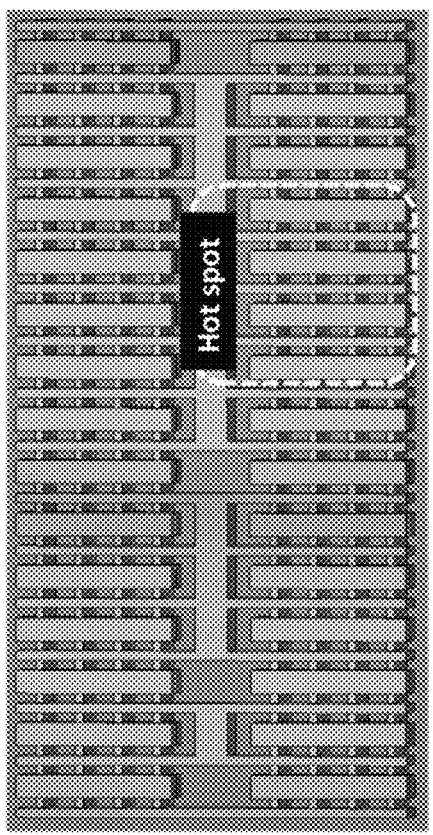
FIG. 1C is a heat map of a layout of a circuit having fingers of transistors are grouped together.
Figure 1D:
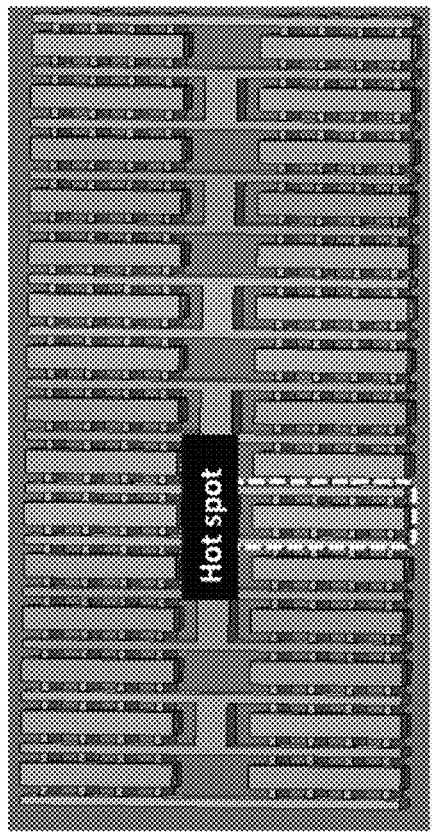
FIG. 1D is a heat map of a layout of a circuit having fingers of transistors separated from each other in accordance with some embodiments.

FIG. 1C is a heat map of a layout of a circuit having fingers of transistors located adjacent to each other. FIG. 1C includes a hot spot having a temperature of about 26° C. In FIG. 1C, lighter grey colors indicate lower temperatures while darker grey colors indicate higher temperatures. FIG. 1D is a heat map of a layout of a circuit having fingers of transistors separated from each other in accordance with some embodiments. As in FIG. 1C, lighter grey colors of FIG. 1D indicate lower temperatures while darker grey colors indicate higher temperatures. In comparison with FIG. 1C, a hot spot in FIG. 1D has a lower temperature. The temperature of the hot spot in FIG. 1D is about 19° C.

Modifying the layout of the circuit similar to layout 100', where a finger group for each device is separated from adjacent finger groups of a same device by at least one finger group of a different device, helps to increase thermal uniformity of a layout in comparison with other layout arrangements. Layout 100' helps to increase thermal uniformity by positioning finger groups of devices subject to a higher power density at locations spaced across the layout to spread out the non-uniform heat generated by the higher power density. In comparison with a layout which includes finger groups of each of inverter 110, inverter 120 and inverter 130 grouped together, layout 100' reduces a temperature of a hottest location in the layout. In some embodiments, the temperature of the hottest location in the layout is reduced by about 20%. In some embodiments, the temperature of the hottest location in the layout is reduced by at least about 28%.

As node sizes decrease and three-dimensional channel structures are used more frequently, managing thermal properties of a circuit becomes more of a challenge. Layout 100' also helps to alleviate non-uniform heating concerns for three-dimensional channel devices such as FinFETs. FinFETs have a reduced heat dissipation capacity in comparison with planar transistors because a contact area between a fin of a FinFET and a substrate is smaller than a contact area between a gate structure of a planar transistor and the substrate. As a result, heat dissipation in the FinFET structure is restricted to an interface between the fin and the substrate and heat which is generated in the FinFET heats the circuit structure more than a planar transistor structure.

Figure 2A:
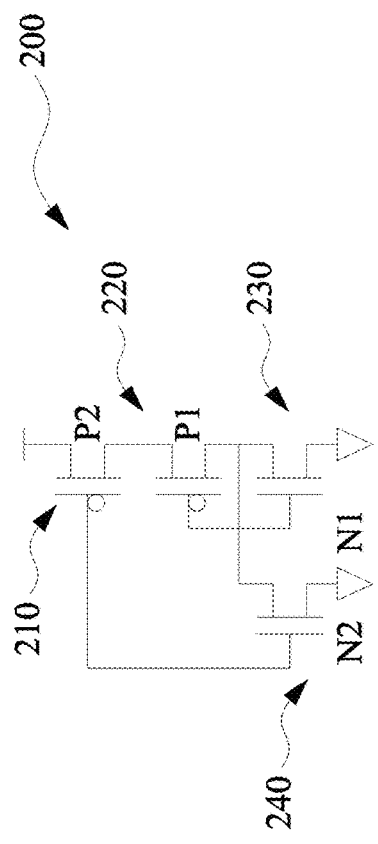
FIG. 2A is a schematic diagram of a circuit in accordance with some embodiments.

FIG. 2A is a schematic diagram of a circuit 200 in accordance with some embodiments. Circuit 200 includes a first transistor 210 connected to a supply voltage. First transistor 210 is a p-type transistor. A second transistor 220 is connected to a drain of first transistor 210. Second transistor 220 is a p-type transistor. A third transistor 230 is connected to a drain of second transistor 220. Third transistor 230 is an n-type transistor. A source of third transistor 230 is connected to a ground voltage. A gate of third transistor 230 is connected to a gate of second transistor 220. A fourth transistor is connected to the drain of second transistor 220 as well as the gates of the second transistor and third transistor 230. Fourth transistor 240 is an n-type transistor. A gate of fourth transistor 240 is connected to a gate of first transistor 210. Circuit 200 is merely an exemplary circuit used to help explain a layout according to some embodiments. In some embodiments, transistors of at least one of first transistor 210, second transistor 220, third transistor 230 or fourth transistor 240 are three dimensional channel transistors, such as FinFET, tri-gate transistors, GAA transistors, or other suitable three dimensional channel transistors.

Figure 2B:
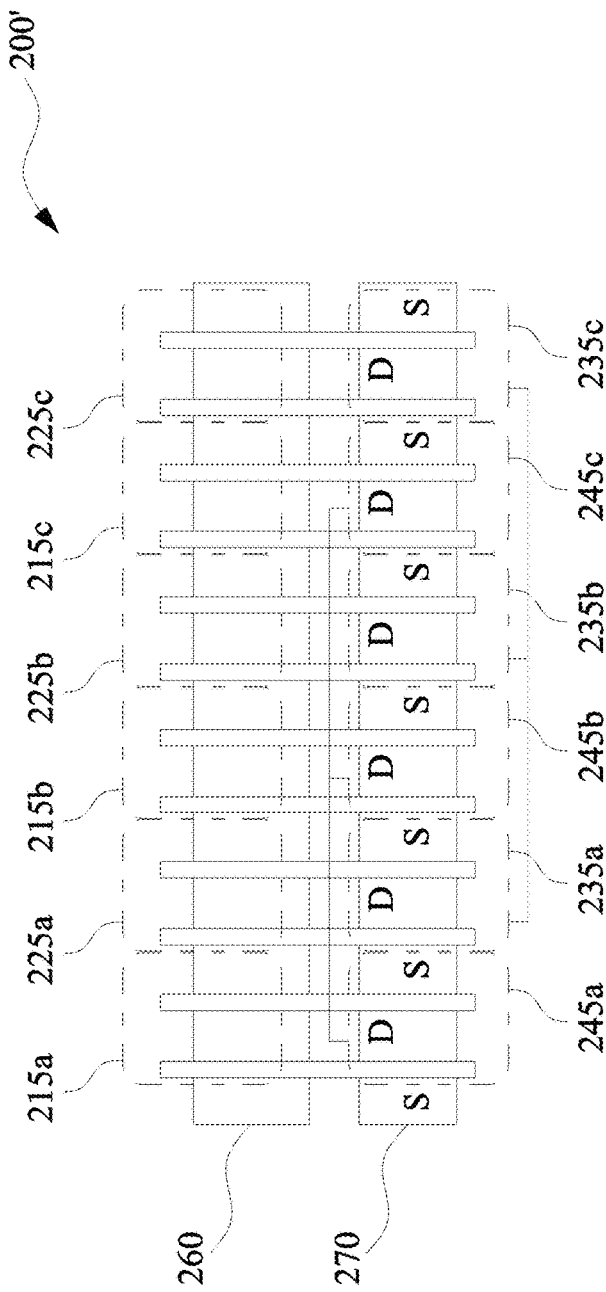
FIG. 2B is a top view of a layout of a circuit in accordance with some embodiments.

FIG. 2B is a top view of a layout 200' of a circuit in accordance with some embodiments. Layout 200' is a layout of circuit 200 (FIG. 2A). Layout 200' includes finger groups 215a, 215b and 215c of first transistor 210 extending across a p-type doped region 260 in a substrate (not shown). Finger groups 215a, 215b and 215c are part of first transistor 210. Finger groups 245a, 245b and 245c extend across an n-type doped region 270 in the substrate. Finger groups 245a, 245b and 245c are part of fourth transistor 240. The fingers extending from finger group 215a are directly connected with the fingers from finger group 245a because the gate of first transistor 210 is connected to the gate of fourth transistor 240. The fingers from finger group 215b are directly connected with the fingers from finger group 245b; and the fingers from finger group 215c are directly connected with fingers from finger group 245c for similar reasons. In some embodiments, the fingers of first transistor 210 are not directly connected to the fingers of fourth transistor 240. In some embodiments, the fingers of first transistor 210 are connected to the fingers of fourth transistor 240 through an interconnect structure (not shown).

Layout 200' includes finger groups 225a, 225b and 225c of second transistor 220 extending across p-type doped region 260 in the substrate. Finger groups 225a, 225b and 225c are part of second transistor 220. Finger groups 235a, 235b and 235c extend across n-type doped region 270 in the substrate. Finger groups 235a, 235b and 235c are part of third transistor 230. The fingers extending from finger group 225a are directly connected with the fingers from finger group 235a because the gate of second transistor 220 is connected to the gate of third transistor 230. The fingers from finger group 225b are directly connected with the fingers from finger group 235b; and the fingers from finger group 225c are directly connected with fingers from finger group 235c for similar reasons. In some embodiments, the fingers of second transistor 220 are not directly connected to the fingers of third transistor 230. In some embodiments, the fingers of second transistor 220 are connected to the fingers of third transistor 230 through the interconnect structure.

Each of first transistor 210, second transistor 220, third transistor 230 and fourth transistor 230 includes six fingers. In some embodiments, at least one of first transistor 210, second transistor 220, third transistor 230 or fourth transistor 240 includes more or less than six fingers. Each finger group of first transistor 210, second transistor 220, third transistor 230 and fourth transistor 230 includes two fingers. In some embodiments, at least one of finger group of first transistor 210, second transistor 220, third transistor 230 or fourth transistor 240 includes more or less than two fingers. In comparison with a layout which includes finger groups of each of first transistor 210, second transistor 220, third transistor 230 and fourth transistor 240 grouped together, layout 220' reduces a temperature of a hottest location in the layout. In some embodiments, the temperature of the hottest location in the layout is reduced by about 20%. In some embodiments, the temperature of the hottest location in the layout is reduced by at least about 25%.

In comparison with layout 100', layout 200' groups fingers in separate doped regions, i.e., p-type doped region 260 and n-type doped region 270, differently. For example, in some embodiments where finger groups of first transistor 210 are not directly connected with finger groups of fourth transistor 240, a finger group located adjacent to the finger groups of the first transistor in n-type doped region 270 is a finger group of third transistor 230. That is, finger group 215a in p-type doped region 260 is spatially adjacent to finger group 235a in n-type doped region 270 in some embodiments.

Figure 3A:
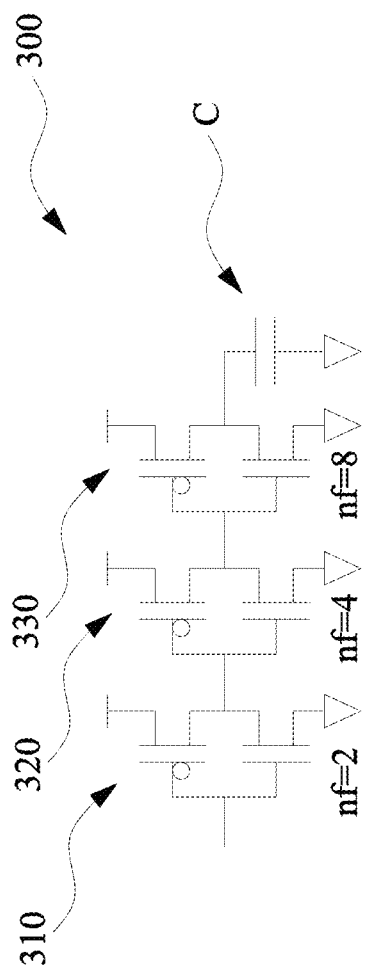
FIG. 3A is a schematic diagram of a circuit in accordance with some embodiments.

FIG. 3A is a schematic diagram of a circuit 300 in accordance with some embodiments. Circuit 300 is similar to circuit 100 (FIG. 1A) and similar elements have a same reference number increased by 200.

Figure 3B:
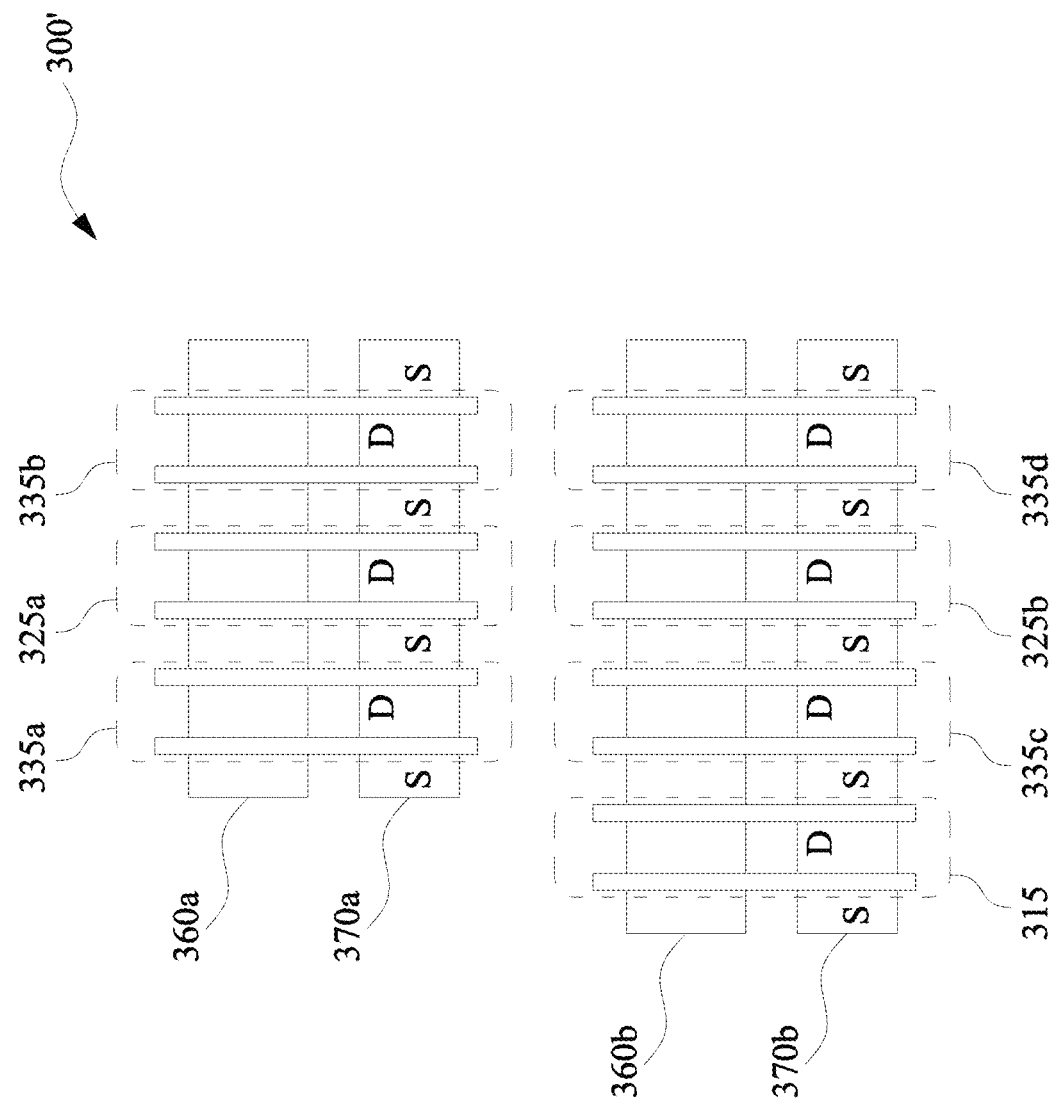
FIG. 3B is a top view of a layout of a circuit in accordance with some embodiments.

FIG. 3B is a top view of a layout 300' of a circuit 300 in accordance with some embodiments. Layout 300' is a layout of circuit 300 (FIG. 3A). Layout 300' includes finger groups 335a and 335b of third inverter 330 extending across a first p-type doped region 360a in a substrate (not shown) and across a first n-type doped region 370a in the substrate. Finger group 225a of second inverter 320 extends across first p-type doped region 360a and first n-type doped region 370a between finger group 335a and finger group 335b. Layout 300' includes finger group 315 of first inverter 310 extending across a second p-type doped region 360b and across a second n-type doped region 370b. Finger groups 335c and 335c of third inverter 330 extend across second p-type doped region 360b and across second n-type doped region 370b. Finger group 225b of second inverter 320 extends across second p-type doped region 360b and second n-type doped region 370b between finger group 335c and finger group 335d.

Layout 300' includes finger groups of an inverter, e.g., inverter 320 or inverter 330, separated from finger groups of the same inverter by at least one finger group of a different inverter, e.g., inverter 310, inverter 320 or inverter 330. In some embodiments, finger groups of a same inverter are separated from each other by a finger group of more than one other inverter. Layout 300' includes each finger group having a same number of fingers. In some embodiments, at least one finger group of layout 300' includes a different number of fingers from at least one other finger group of the layout. Layout 300' includes two fingers per finger group. In some embodiments, at least one finger group of layout 300' includes more than two fingers. In some embodiments, a number of fingers in each finger group of layout 300' is an even integer greater than or equal to two.

In comparison with layout 100', layout 300' includes discontinuous p-type doped regions and n-type doped regions. Layout 300' includes two p-type doped regions 360a and 360b and two n-type doped regions 370a and 370b. In some embodiments, layout 300' includes more than two discontinuous p-type doped regions. In some embodiments, layout 300' includes more than two discontinuous n-type doped regions. In some embodiments, a number of discontinuous p-type doped regions is equal to a number of discontinuous n-type doped regions. In some embodiments, the number of discontinuous p-type doped regions is different from the number of discontinuous n-type doped regions.

First p-type doped region 360a is spaced from second p-type doped region 360b in a direction perpendicular to a longitudinal direction of the first p-type doped region. In some embodiments, first p-type doped region 360a is spaced from second p-type doped region 360b in a direction parallel to the longitudinal direction of the first p-type doped region. In some embodiments, first p-type doped region 360a is spaced from second p-type doped region 360b in a direction angled with respect to the longitudinal direction of the first p-type doped region. In some embodiments, first p-type doped region 360a is formed in a substrate different from second p-type doped region 360b. First n-type doped region 370a is spaced from second n-type doped region 370b in a direction perpendicular to a longitudinal direction of the first n-type doped region. In some embodiments, first n-type doped region 370a is spaced from second n-type doped region 370b in a direction parallel to the longitudinal direction of the first n-type doped region. In some embodiments, first n-type doped region 370a is spaced from second n-type doped region 370b in a direction angled with respect to the longitudinal direction of the first n-type doped region. In some embodiments, first n-type doped region 370a is formed in a substrate different from second n-type doped region 370b. In some embodiments, a spacing direction between first p-type doped region 360a and second p-type doped region 360b is a same direction as a spacing direction between first n-type doped region 370a and second n-type doped region 370b. In some embodiments, the spacing direction between first p-type doped region 360a and second p-type doped region 360b is a different direction from the spacing direction between first n-type doped region 370a and second n-type doped region 370b.

Figure 4:
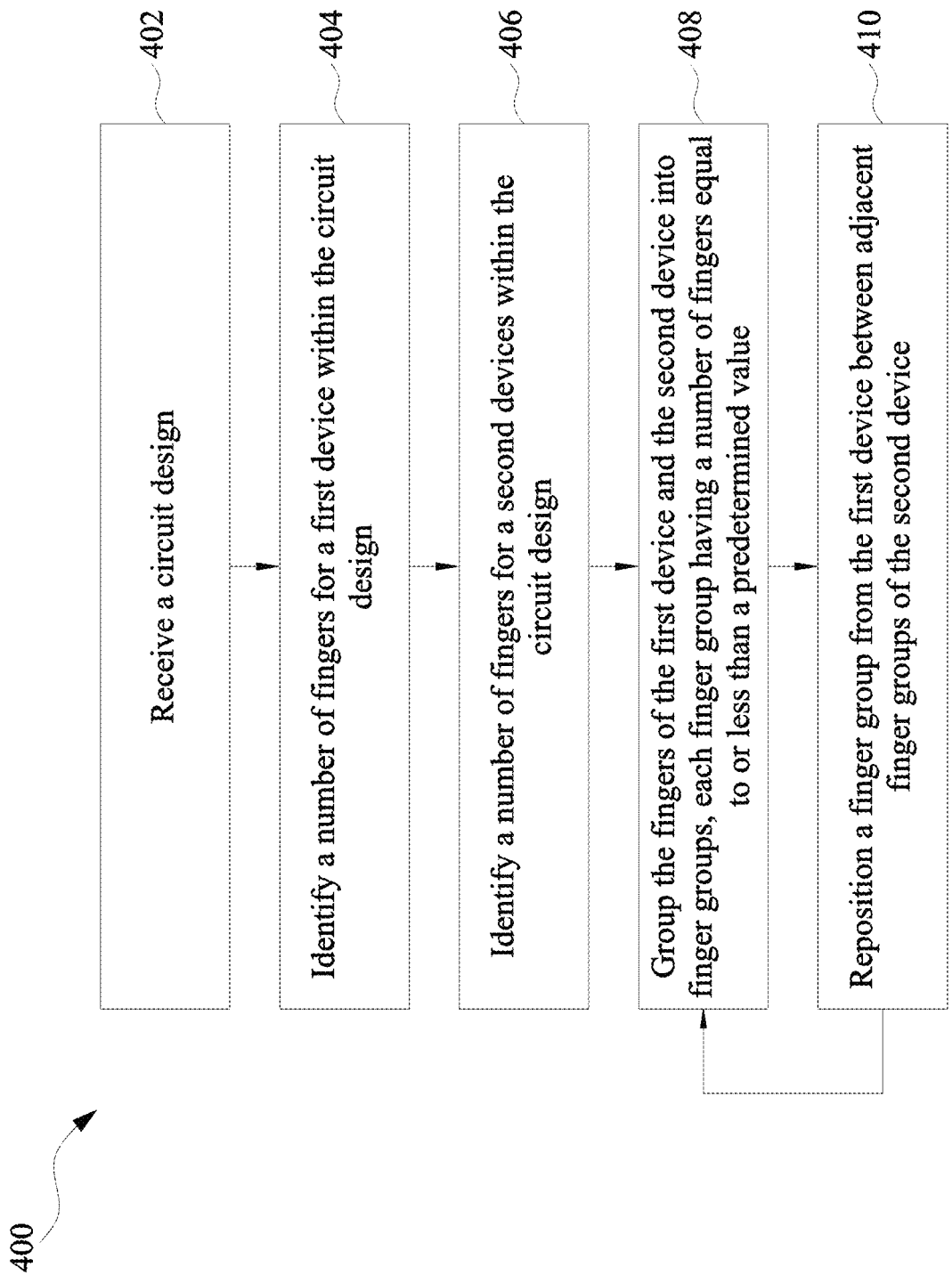
FIG. 4 is a flowchart of a layout method in accordance with some embodiments.

FIG. 4 is a flowchart of a layout method 400 in accordance with some embodiments. In optional operation 402, a circuit design is received. In some embodiments, the circuit design is stored on a computer readable medium. In some embodiments, the circuit design includes a schematic diagram. The schematic diagram is converted into a layout in operation 402 by a computing device configured to implement method 400. In some embodiments, the circuit design includes a layout. In some embodiments, the circuit design is received from a customer. In some embodiments, the circuit design is received from a circuit designer. In some embodiments, the layout is generated based on instructions from a layout engineer. In some embodiments, operation 402 is omitted. In some embodiments, operation 402 is omitted when the circuit design is already stored in the computing device. In some embodiments, the circuit design is part of a cell library, or another suitable standard cell database. In some embodiments, operation 402 is omitted when method 400 is used to generate an initial circuit design which is not based on a previous circuit design.

In operation 404, a number of fingers of a first device within the circuit design is identified. In some embodiments, the number of fingers is identified based on specifications from the circuit designer or the layout engineer. In some embodiments, the number of fingers is determined based on information in a cell library or another suitable standard cell database.

In operation 406, a number of fingers of a second device within the circuit design is identified. In some embodiments, the number of fingers is identified based on specifications from the circuit designer or the layout engineer. In some embodiments, the number of fingers is determined based on information in a cell library or another suitable standard cell database. In some embodiments, the number of fingers of the first device is determined using a same type of information as the number of fingers of the second device. In some embodiments, the number of fingers of the first device is determined using a different type of information from the number of fingers of the second device. For example, in some embodiments, the circuit designer specifies the number of fingers in the first device and the number of fingers in the second device is determined based on information from a cell library.

The fingers of the first device and the second device are grouped into finger groups in operation 408. Each finger group has a number of fingers equal to or less than a predetermined value. In some embodiments, the predetermined value is specified by the circuit designer or the layout engineer. In some embodiments, the predetermined value is two. In some embodiments, the predetermined value is greater than two. In some embodiments, the predetermined value is an even integer greater than or equal to two. In some embodiments, the predetermined value for the first device is equal to the predetermined value for the second device. In some embodiments, the predetermined value for the first device is different from the predetermined value for the second device.

In operation 410, a finger group of the first device is repositioned to be between adjacent finger groups of the second device. Similarly, a finger group of the second device is positioned between adjacent finger groups of the first device. In some embodiments, the finger groups are arranged on continuous p-type doped regions or n-type doped regions, e.g., p-type doped region 160 (FIG. 1B) or n-type doped region 170. In some embodiments, at least one finger group of the first device are arranged on separate discontinuous p-type doped region or discontinuous n-type doped region, e.g., p-type doped region 360a (FIG. 3B) or n-type doped region 370a, from at least another finger group of the first device. In some embodiments, at least one finger group of the second device is arranged on a separate discontinuous p-type doped region or a discontinuous n-type dope region from at least another finger group of the second device.

In some embodiments, method 400 returns to operation 408 if a number of finger groups for the first device and a number of finger groups for the second device cannot be positioned as described in operation 410. For example, in some embodiments, first device includes two fingers and second device includes eight fingers. In operation 408, the predetermined value for both the first device and the second device is two resulting in one finger group for the first device and four finger groups for the second device. The number of finger groups for second device does not permit the single finger group from the first device to be placed between each adjacent finger group of the second device. Method 400 returns to operation 408 and the predetermined value for the second device is increased to four resulting in two finger groups for the second device. Now, in operation 410 the single finger group of the first device is able to be positioned between adjacent finger groups, each containing four fingers, of the second device.

Method 400 produces a layout in which adjacent finger groups of a same device are separated by at least one finger group from at least one other device. Method 400 refers to two devices for simplicity. In some embodiments, method 400 is used for a circuit design including more than two devices.

Figure 5:
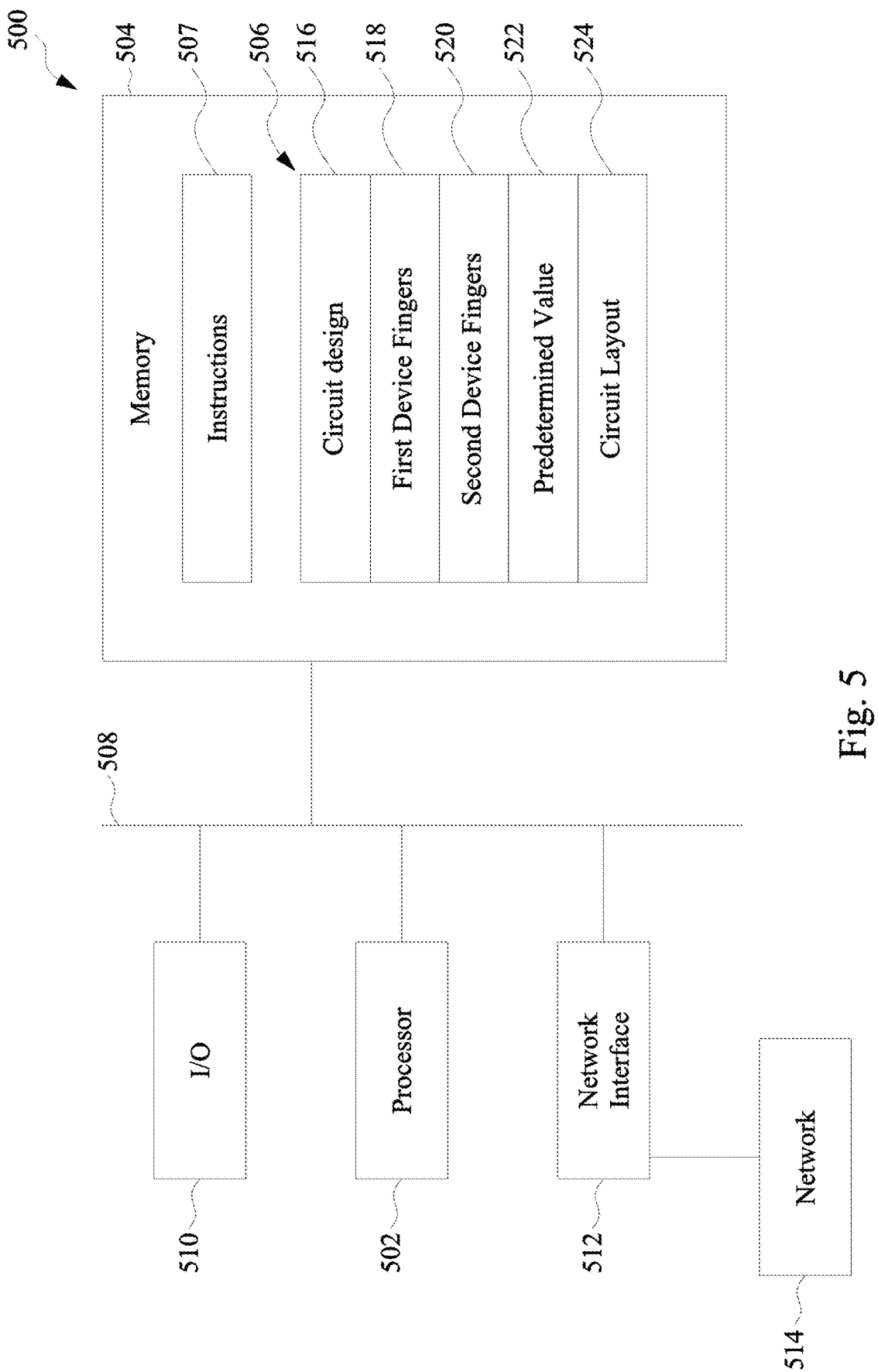
FIG. 5 is a block diagram of a specific computing device for implementing a layout method in accordance with some embodiments.

FIG. 5 is a block diagram of a specific computing device 500 for implementing a layout method in accordance with some embodiments. Computing device 500 includes a hardware processor 502 and a non-transitory, computer readable storage medium 504 encoded with, i.e., storing, computer program code 506, i.e., a set of executable instructions. Computer readable storage medium 504 is also encoded with instructions 507 for interfacing with manufacturing machines for producing the memory array. The processor 502 is electrically coupled to the computer readable storage medium 504 via a bus 508. The processor 502 is also electrically coupled to an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program code 506 encoded in the computer readable storage medium 504 in order to cause computing device 500 to be usable for performing a portion or all of the operations as described in method 400.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 504 stores the computer program code 506 configured to cause system 500 to perform method 300 or method 400. In some embodiments, the storage medium 504 also stores information needed for performing a method 400 as well as information generated during performing the method 400, such as a circuit design parameter 516, a first device fingers parameter 518, an second device fingers parameter 520, a predetermined value parameter 522, a circuit layout parameter 524 and/or a set of executable instructions to perform the operation of method 400.

In some embodiments, the storage medium 504 stores instructions 507 for interfacing with manufacturing machines. The instructions 507 enable processor 502 to generate manufacturing instructions readable by the manufacturing machines to effectively implement method 400 during a manufacturing process.

Computing device 500 includes I/O interface 510. I/O interface 510 is coupled to external circuitry. In some embodiments, I/O interface 510 includes a keyboard, keypad, mouse, trackball, trackpad, and/or cursor direction keys for communicating information and commands to processor 502.

Computing device 500 also includes network interface 512 coupled to the processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394. In some embodiments, method 400 is implemented in two or more computing devices 500, and information such as circuit design, number of fingers, predetermined value or circuit layout are exchanged between different computing devices 500 via network 514.

Computing device 500 is configured to receive information related to a circuit design through I/O interface 510. The information is transferred to processor 502 via bus 508 to determine a circuit design for method 400. The circuit design is then stored in computer readable medium 504 as circuit design parameter 516. Computing device 500 is configured to receive information related to a number of first device fingers through I/O interface 510. The information is stored in computer readable medium 504 as first device fingers parameter 518. Computing device 500 is configured to receive information related to a number of second device fingers through I/O interface 510. The information is stored in computer readable medium 504 as second device fingers parameter 520. Computing device 500 is configured to receive information related to a predetermined value through I/O interface 510. The information is stored in computer readable medium 504 as predetermined value parameter 522. During operation, processor 502 executes a set of instructions to determine a circuit layout and the circuit layout is stored in computer readable medium 504 as circuit layout parameter 524.

An aspect of this description relates to a method including identifying fingers of a first device. The method further includes grouping the fingers of the first device into a first finger group and a second finger group, wherein the first finger group is electrically connected to the second finger group. The method further includes positioning the first finger group extends across a first doped region. The method further includes positioning the second finger group extends across a second doped region, wherein the second doped region has a same dopant type as the first doped region. The method further includes identifying fingers of a second device. The method further includes grouping the fingers of the second device into a third finger group and a fourth finger group, wherein the third finger group is electrically connected to the fourth finger group. The method further includes positioning the third finger group and the fourth finger group extending across the second doped region, wherein a number of finger groups extending across the first doped region is different from a number of finger groups extending across the second doped region. In some embodiments, positioning the second finger group includes positioning the second finger group extending across the second doped region physically separated from the first doped region. In some embodiments, positioning the second finger group includes positioning the second finger group between the third finger group and the fourth finger group. In some embodiments, the method further includes receiving a circuit design. In some embodiments, identifying the fingers of the first device includes identifying the fingers of the first device based on the received circuit design. In some embodiments, identifying the fingers of the second device includes identifying the fingers of the second device based on the received circuit design. In some embodiments, the method further includes identifying fingers of a third device; grouping the fingers of the third device into a fifth finger group and a sixth finger group, wherein the fifth group is electrically connected to the sixth group; and positioning the fifth finger group and the sixth finger group extending across the first doped region. In some embodiments, positioning the first finger group includes positioning the first finger group between the fifth finger group and the sixth finger group. In some embodiments, positioning the first finger group includes positioning the first finger group extending across a third doped region, wherein the third doped region has an opposite dopant type from the first doped region. In some embodiments, positioning the second finger group includes positioning the second finger group extending across a third doped region, wherein the third doped region has an opposite dopant type from the second doped region.

An aspect of this description relates to a method including receiving a circuit design, wherein the circuit design includes a first device and a second device. The method further includes identifying fingers of the first device, wherein each finger of the fingers of the first device are electrically connected together. The method further includes identifying fingers of the second device, wherein each finger of the fingers of the second device are electrically connected together. The method further includes repositioning a first finger group of the fingers of the first device from a first position to a second position, wherein the repositioned first finger group extends across a first doped region. The method further includes repositioning a second finger group of the fingers of the first device from a third position to a fourth position, wherein the repositioned second finger group extends across a second doped region having a same dopant type as the first doped region, and the repositioned second finger group is between a third finger group of the fingers of the second device and a fourth finger group of the fingers of the second device. In some embodiments, the method further includes repositioning the third finger group from a fifth position to a sixth position. In some embodiments, repositioning the second finger group includes repositioning the second finger group such that a number of finger groups extending across the first doped region is different from a number of finger groups extending across the second doped region. In some embodiments, repositioning the second finger group includes repositioning the second finger group extending across the second doped region physically separated from the first doped region. In some embodiments, repositioning the first finger group includes repositioning the first finger group extending across a third doped region, wherein the third doped region has an opposite dopant type from the first doped region. In some embodiments, repositioning the second finger group includes repositioning the second finger group extending across a third doped region, wherein the third doped region has an opposite dopant type from the second doped region.

An aspect of this description relates to a method including receiving a circuit design, wherein the circuit design includes a first device and a second device. The method further includes identifying fingers of the first device. The method further includes grouping the identified fingers of the first device into a first finger group and a second finger group, wherein the first finger group is electrically connected to the second finger group. The method further includes identifying fingers of the second device. The method further includes grouping the identified fingers of the second device into a third finger group and a fourth finger group, wherein the third finger group is electrically connected to the fourth finger group. The method further includes repositioning a first finger group of the fingers of the first device from a first position to a second position, wherein the repositioned first finger group extends across a first doped region and a second doped region, and the first doped region has an opposite dopant type from the second doped region. The method further includes repositioning a second finger group of the fingers of the first device from a third position to a fourth position, wherein the repositioned second finger group extends across a third doped region having a same dopant type as the first doped region and across a fourth doped region having a same dopant type as the second doped region, the third doped region is physically separate from the first doped region, and the fourth doped region is physically separate from the second doped region. In some embodiments, repositioning the second finger group includes repositioning second finger group to be between the third finger group and the fourth finger group. In some embodiments, receiving the circuit design includes receiving the circuit design having the first finger group at the first position. In some embodiments, repositioning the first finger group includes repositioning the first finger group to be between adjacent finger groups of a third device of the circuit design.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   identifying fingers of a first device;
   grouping the fingers of the first device into a first finger group and a second finger group, wherein the first finger group is electrically connected to the second finger group;
   positioning the first finger group extends across a first doped region;
   positioning the second finger group extends across a second doped region, wherein the second doped region has a same dopant type as the first doped region;
   identifying fingers of a second device, wherein the second device has a different number of fingers from the first device;
   grouping the fingers of the second device into a third finger group and a fourth finger group, wherein the third finger group is electrically connected to the fourth finger group; and
   positioning the third finger group and the fourth finger group extending across the second doped region, wherein a number of finger groups extending across the first doped region is different from a number of finger groups extending across the second doped region, and each of the finger groups extending across the first doped region and each of the finger groups extending across the second doped region comprises a plurality of fingers.

2. The method of claim 1, wherein positioning the second finger group comprises positioning the second finger group extending across the second doped region physically separated from the first doped region.

3. The method of claim 1, wherein positioning the second finger group comprises positioning the second finger group between the third finger group and the fourth finger group.

4. The method of claim 1, further comprising receiving a circuit design.

5. The method of claim 4, wherein identifying the fingers of the first device comprises identifying the fingers of the first device based on the received circuit design.

6. The method of claim 4, wherein identifying the fingers of the second device comprises identifying the fingers of the second device based on the received circuit design.

7. The method of claim 1, further comprising:
   identifying fingers of a third device;
   grouping the fingers of the third device into a fifth finger group; and
   positioning the fifth finger group extending across the second doped region.

8. The method of claim 7, wherein positioning the fifth finger group comprises positioning the fifth finger group adjacent to the third finger group.

9. The method of claim 1, wherein positioning the first finger group comprises positioning the first finger group extending across a third doped region, wherein the third doped region has an opposite dopant type from the first doped region.

10. The method of claim 1, wherein positioning the second finger group comprises positioning the second finger group extending across a third doped region, wherein the third doped region has an opposite dopant type from the second doped region.

11. A method comprising:
    receiving a circuit design, wherein the circuit design comprises a first device and a second device;
    identifying fingers of the first device, wherein each finger of the fingers of the first device are electrically connected together;
    identifying fingers of the second device, wherein each finger of the fingers of the second device are electrically connected together, and the second device has a different number of fingers from the first device;
    repositioning a first finger group of the fingers of the first device from a first position to a second position, wherein the repositioned first finger group extends across a first doped region; and
    repositioning a second finger group of the fingers of the first device from a third position to a fourth position, wherein the repositioned second finger group extends across a second doped region having a same dopant type as the first doped region, the repositioned second finger group is between a third finger group of the fingers of the second device and a fourth finger group of the fingers of the second device, a number of finger groups extending across the first doped region is different from a number of finger groups extending across the second doped region, and each of the finger groups extending across the first doped region and each of the finger groups extending across the second doped region comprises a plurality of fingers.

12. The method of claim 11, further comprising repositioning the third finger group from a fifth position to a sixth position.

13. The method of claim 11, wherein repositioning the second finger group comprises repositioning the second finger group such that a number of finger groups extending across the first doped region is different from a number of finger groups extending across the second doped region.

14. The method of claim 11, wherein repositioning the second finger group comprises repositioning the second finger group extending across the second doped region physically separated from the first doped region.

15. The method of claim 11, wherein repositioning the first finger group comprises repositioning the first finger group extending across a third doped region, wherein the third doped region has an opposite dopant type from the first doped region.

16. The method of claim 11, wherein repositioning the second finger group comprises repositioning the second finger group extending across a third doped region, wherein the third doped region has an opposite dopant type from the second doped region.

17. A method comprising:
receiving a circuit design, wherein the circuit design comprises a first device and a second device, the first device has a first finger group at a first position and a second finger group at a second position, the first finger group is electrically connected to the second finger group, the second device has a third finger group and a fourth finger group, the third finger group is electrically connected to the fourth finger group, the second device has a different number of fingers from the first device, and a number of fingers in each of the first finger group, the second finger group, the third finger group and the fourth finger group is equal;
repositioning the first finger group from the first position to a third position, wherein the repositioned first finger group extends across a first doped region and a second doped region, and the first doped region has an opposite dopant type from the second doped region; and
repositioning the second finger group from the second position to a fourth position, wherein the repositioned second finger group extends across a third doped region having a same dopant type as the first doped region and across a fourth doped region having a same dopant type as the second doped region, the third doped region is physically separate from the first doped region, the fourth doped region is physically separate from the second doped region, a number of finger groups extending across the first doped region is different from a number of finger groups extending across the third doped region, and each of the finger groups extending across the first doped region and each of the finger groups extending across the third doped region comprises a plurality of fingers.

18. The method of claim 17, wherein repositioning the second finger group comprises repositioning second finger group to be between the third finger group and the fourth finger group.

19. The method of claim 17, wherein receiving the circuit design comprises receiving the circuit design.

20. The method of claim 17, wherein repositioning the first finger group comprises repositioning the first finger group to be adjacent to a finger group of a third device of the circuit design.

* * * * *